(12) United States Patent
Boyd et al.

(10) Patent No.: US 10,535,981 B1
(45) Date of Patent: Jan. 14, 2020

(54) INTEGRATED OPTICAL DETECTION FOR ATOMIC CLOCKS AND SENSORS

(71) Applicant: AOSense, Inc., Sunnyvale, CA (US)

(72) Inventors: Martin M. Boyd, Sunnyvale, CA (US);
Adam T. Black, Annandale, VA (US);
Brian R. Patton, San Francisco, CA (US); Miao Zhu, San Jose, CA (US)

(73) Assignee: AOSense, Inc., Sunnyvale, CA (US)

( * ) Notice: Subject to any disclaimer, the term of this patent is extended or adjusted under 35 U.S.C. 154(b) by 5 days.

(21) Appl. No.: 15/967,407

(22) Filed: Apr. 30, 2018

Related U.S. Application Data

(60) Provisional application No. 62/492,876, filed on May 1, 2017, provisional application No. 62/492,872, filed on May 1, 2017, provisional application No. 62/492,874, filed on May 1, 2017.

(51) Int. Cl.
*H01S 5/14* (2006.01)
*G04F 5/14* (2006.01)
*H03L 7/26* (2006.01)
*H01S 3/105* (2006.01)
*H01S 3/08* (2006.01)

(52) U.S. Cl.
CPC ............... *H01S 5/142* (2013.01); *G04F 5/14* (2013.01); *H01S 3/08086* (2013.01); *H01S 3/105* (2013.01); *H03L 7/26* (2013.01)

(58) Field of Classification Search
CPC ........................................................ H01S 5/142
USPC ........................................................ 331/94.1
See application file for complete search history.

(56) References Cited

U.S. PATENT DOCUMENTS 8,526,000 B1 * 9/2013 Schober ................. G02B 27/00
356/432
2017/0281102 A1 * 10/2017 Ken ..................... A61B 6/4258

* cited by examiner

*Primary Examiner* — Joseph Chang
(74) *Attorney, Agent, or Firm* — Van Pelt, Yi & James LLP

(57) ABSTRACT

A device for preparing an ensemble of laser-cooled atoms and measuring their population includes a laser and a set of reflecting surfaces. The laser is able to produce a laser beam. The set of reflecting surfaces disposed to direct the laser beam along a multi-dimensional beam path to intersect a central space multiple times from different directions and retroreflect the laser beam to retrace the multi-dimensional beam path. The central space is able to have an ensemble of atoms or molecules. The atoms or the molecules are able to be cooled along one or more dimensions by the laser beam sent along the multi-dimensional beam path and able to be detected in the central space by an effect upon the laser beam sent along the multi-dimensional beam path.

22 Claims, 10 Drawing Sheets

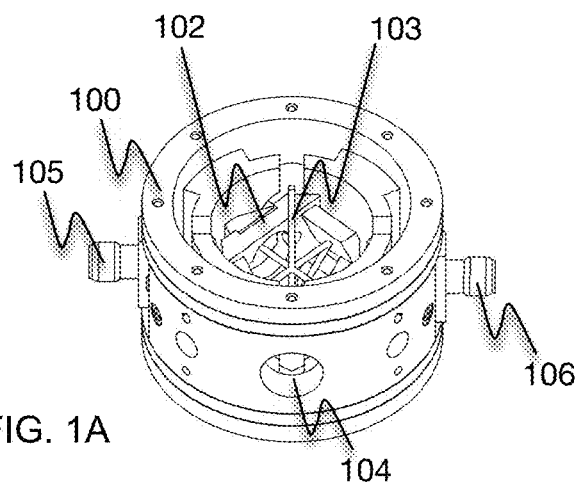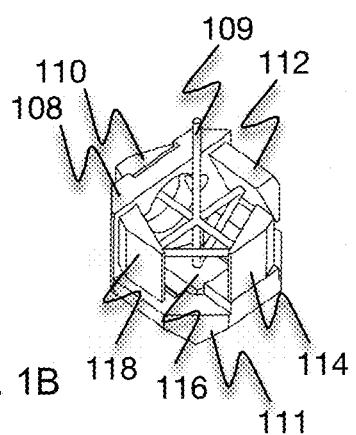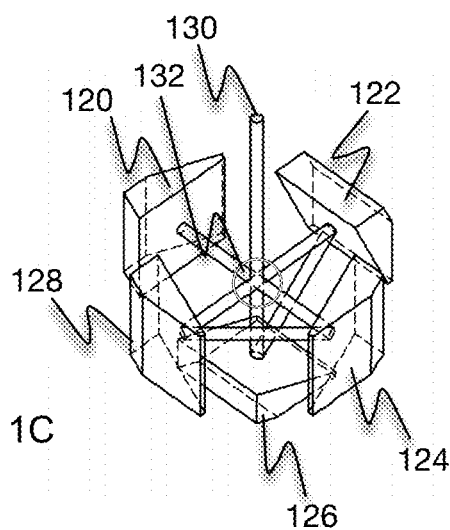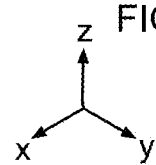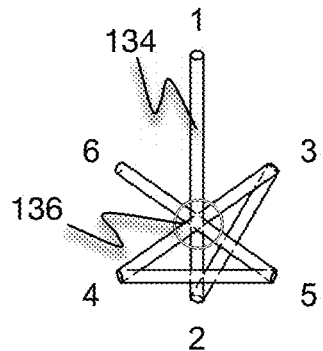
FIG. 1A  FIG. 1B  FIG. 1C  FIG. 1D

INTEGRATED OPTICAL DETECTION FOR ATOMIC CLOCKS AND SENSORS

CROSS REFERENCE TO OTHER APPLICATIONS

This application claims priority to U.S. Provisional Patent Application No. 62/492,876 entitled INTEGRATED OPTICAL DETECTION FOR ATOMIC CLOCKS AND SENSORS filed May 1, 2017 which is incorporated herein by reference for all purposes. This application also claims priority to U.S. Provisional Patent Application No. 62/492,872 entitled ARCHITECTURE FOR COMPACT COLD ATOM CLOCKS filed May 1, 2017 which is incorporated herein by reference for all purposes. This application also claims priority to U.S. Provisional Patent Application No. 62/492,874 entitled LASER SYSTEM FOR ATOMIC CLOCKS AND SENSORS filed May 1, 2017 which is incorporated herein by reference for all purposes.

This invention was made with Government support under Contract # D14PC00136 AND D15PC00053 awarded by DARPA. The Government has certain rights in the invention.

BACKGROUND OF THE INVENTION

Atomic clock stability and precision are fundamental to the performance of many applications including global positioning systems (GPS), advanced communications systems, and synthetic aperture radar. However, cost, complexity, clock size, and the state of current technology prevent advanced low-noise clocks from being used in these and many other applications. High-stability clocks can improve GPS performance and system integrity by reducing noise and extending the time duration between clock corrections. The use of portable high-performance clocks to distribute and decentralize precision timekeeping can help eliminate single point of failure weaknesses and ensure the integrity of communications and data storage transactions—even in GPS-denied environments. Advanced communication and synthetic aperture radar techniques can benefit from the low-phase-noise, low-drift microwave signals provided by atomic clocks. However, many of these applications are critically dependent on achieving high performance by maximizing signal-to-noise ratio (SNR) while minimizing size, weight, and power. Current atomic clocks contain multiple lasers and each laser contributes to the size, weight, and power requirements for the clock. Such devices typically utilize a cloud of atoms collected and laser-cooled in an atom trap within a vacuum chamber. The designs of the trapping and detection laser system and optical layout have a major impact on the complexity and resulting size of the complete device. In many cold-atom clocks, measurement of the final atomic state is achieved via fluorescence detection. However, capturing fluorescence and minimizing detection of unwanted scattered light tend to be competing goals. In addition, multiple lasers provide potential points of failure and potential sources of instability for the system. A significant performance gap remains between atomic clocks developed in research laboratories and those that can be deployed into mobile environments.

BRIEF DESCRIPTION OF THE DRAWINGS

Various embodiments of the invention are disclosed in the following detailed description and the accompanying drawings.

FIG. 1A is a diagram illustrating an embodiment of a 3D rendering of a uW cavity design.

FIG. 1B is a diagram illustrating an embodiment of a 3D rendering of an internal opto-mechanical assembly and beam path.

FIG. 1C is a diagram illustrating an embodiment of a zoom of an optical beam path and 3D OCR racetrack.

FIG. 1D is a diagram illustrating an embodiment of a zoom of an optical beam path.

DETAILED DESCRIPTION

Figure 2:
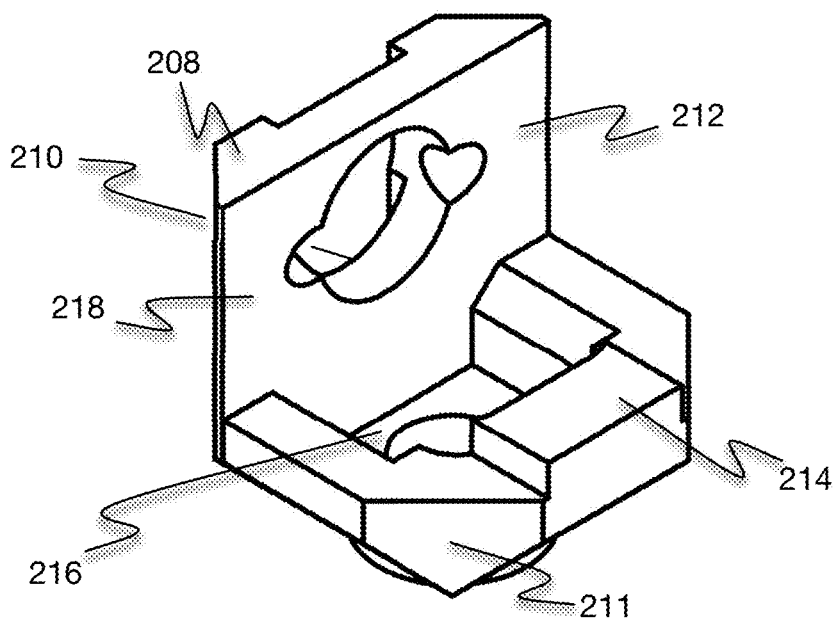
FIG. 2 is a diagram illustrating an embodiment of a 3D rendering of an internal mounting frame assembly.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A device for preparing an ensemble of laser-cooled atoms and measuring their population is disclosed. The device for preparing an ensemble of laser-cooled atoms and measuring their population comprises a laser, where the laser is able to produce a laser beam. The device further comprises a set of reflecting surfaces, where the set of reflecting surfaces are disposed to direct the laser beam along a multi-dimensional beam path to intersect a central space multiple times from different directions and retroreflect the laser beam to retrace the multi-dimensional beam path, where the central space is able to have an ensemble of atoms or molecules, and where the atoms or the molecules are able to be cooled along one or more dimensions by the laser beam sent along the multi-dimensional beam path and able to be detected in the central space by an effect upon the laser beam sent along the multi-dimensional beam path.

In some embodiments, the device for preparing an ensemble of laser-cooled atoms and measuring their population comprises a frame, where the set of reflecting surfaces are mounted to the frame to generate a single optical assembly. In some embodiments, the set of reflecting surfaces comprises five reflecting surfaces, and the multi-dimensional beam path spans three dimensions. The multi-dimensional beam path intersects a central space multiple times from different directions and retroreflects the laser beam to retrace the multi-dimensional beam path. The central space is able to have an ensemble of atoms or molecules where the atoms or the molecules are able to be cooled along one or more dimensions by the laser beam sent along the multi-dimensional beam path. The atoms or the molecules are further able to be detected in the central space by an effect upon the laser beam sent along the multi-dimensional beam path. For example, the number of atoms in an atomic state can be assessed with high efficiency and with minimal added complexity to the laser system or optical design by using an optical absorption or dispersion measurement induced by the atoms in the laser sent along the beam path. The intensity and/or the frequency of the laser beam(s) can be optimized for cooling, state preparation, and detection. The laser beam(s) may be routed into and back out of the atom interrogation region in an intersecting beam path configuration in which the laser beam is redirected to interact with an ensemble of atoms via multiple passes and retroreflected to retrace its path. The laser beam is called different things at a particular instant in the timing sequence, however the laser beam is generated from the same laser traveling along the same path. Depending on the laser beam's detuning and power it might be called the "cooling", "state preparation", or "detection" beam.

In various embodiments, the intersecting beam path configurations include an optical racetrack, retroreflection by a reflector, a series of beam-splitters each used to split off light from a single source and subsequently directed toward the ensemble of atoms, or any other appropriate optical layout in which multiple beams of light derived from a single laser beam passing through the ensemble of atoms multiple times may be combined on a single photodiode after exiting the ensemble of atoms.

In the racetrack configuration, a single optical beam enters the optical racetrack along a given axis; it is then directed via mirrors along multiple axes within the atom-containing region to achieve laser cooling (in cold-atom clocks) and/or atom state preparation (in cold-atom clocks or vapor-cell clocks). In some embodiments, separate and/or additional beams may be used for state preparation. The racetrack retroreflects the beam so that it retraces the same path back out of the atom-containing region. After completion of the atomic resonance sequence, the final atom state population is measured via absorption or dispersion of a beam sent along the same optical racetrack as the initial laser cooling and or state-preparation beam(s). Agile control of the laser frequency and intensity can be used to implement laser cooling, state preparation, and atom detection as needed. In some embodiments, an optical frequency and/or a power of the laser beam are independently optimized to permit the laser beam to carry out sequential steps of atom cooling/trapping, atom state preparation, and/or atom detection. Advantages of this design include reduced laser system complexity (the same beam can be used for state preparation and readout), simplified optical design (no additional optical paths, additional optical elements, or apertures in the enclosure are required), improved signal amplitude (the beam passes through the atomic sample multiple times, enhancing the detection signal), and reduction of signal background (light scattered off optical elements does not contribute to the measurement). Applications include sensors based on laser-cooled atoms, sensors based on thermal atomic or molecular beams, and/or sensors based on atomic vapor cells.

Compact devices based on laser-cooled atoms have many applications in precision navigation and timing. Inertial sensors based on atom interferometry can be used to measure rotation, acceleration, and gravity to facilitate inertial navigation or platform stabilization such as precision pointing. Similarly, numerous applications can benefit from compact, high-stability atomic clocks. High-stability clocks could improve GPS performance and system integrity by reducing noise and extending the time duration between clock corrections. Use of portable high-performance clocks to distribute and decentralize precision timekeeping can help eliminate single point of failure weaknesses and ensure integrity of communications and data storage transactions, even in GPS-denied environments. Advanced communication and synthetic aperture radar techniques can benefit from the low-phase-noise, low-drift microwave signals provided by atomic clocks.

Many applications are critically dependent on achieving high performance by maximizing signal-to-noise ratio (SNR) while minimizing size, weight, and power (SWAP). Such devices typically utilize a cloud of atoms collected and laser-cooled in an atom trap within a vacuum chamber. The designs of the trapping and detection laser system and optical layout have a major impact on the complexity and resulting size of the complete device.

There are various types of atomic frequency standards, including vapor-cell atomic clocks, laser-cooled atomic clocks, thermal beam atomic clocks, and trapped ion clocks. In vapor-cell atomic clocks, the atomic ensemble is enclosed in a vapor cell (often with a buffer gas to inhibit collisions with the cell walls), and the kinetic temperature of the atoms is the same as that of the surrounding cell. In laser-cooled atomic clocks, optical beams are used to slow the atoms in one or more dimensions such that the resulting kinetic energy distribution is described by a low temperature; in this case, buffer gases are generally omitted. Frequency standards based on laser-cooled atoms tend to be improve on many sources of inaccuracy and drift which affect vapor-cell atomic clocks—namely, drifts due to temperature and pressure variations within the buffer-gas cell. In both types of clock, it is usually desirable to enclose the atomic ensemble within a microwave cavity and/or magnetic shields, in order to provide homogeneous excitation of a microwave resonance and to shield the atoms from undesirable environmental perturbations. In both types of clock, optical state preparation yields a non-equilibrium population imbalance within the atomic sample prior to excitation of an atomic resonance; evolution of the atomic populations according to this resonance serves as the basis for a frequency measurement. A time measurement may be performed by counting oscillations of a stable frequency reference such as described above. Any element with transitions that are addressable by laser cooling techniques may be used for the atomic source, with typical choices including appropriate isotopes of alkali atoms (cesium, rubidium, etc.) or alkaline earth atoms (strontium, calcium, etc.) or any other appropriate atoms.

In many cold-atom clocks, measurement of the final atomic state is achieved via fluorescence detection: a monochromatic optical beam excites the atoms, which then emit fluorescent photons that can be recorded by a detector. The amount of fluorescence indicates the number of atoms in the particular state that are resonant with the optical excitation. In many cold-atom clocks, the optical beam used to excite fluorescence follows a different path than the one followed by the beam(s) used to prepare the atoms prior to the clock cycle. In the presence of significant background vapor, the detection beam is often made smaller than the trapping beams. In some cases, additional optical elements are incorporated within the atom-containing region in order to capture the atomic fluorescence with maximum efficiency. It is often the case that the detection beam scatters off optical or mechanical elements within the apparatus, emitting photons into the fluorescence detector and contributing a background signal that degrades the contrast of the atomic clock signal. Maximizing the captured fluorescence and minimizing detection of unwanted scattered light tend to be competing goals. Moreover, the addition of secondary optical apertures to shape the detection beam or define the imaged region of fluorescence can pose challenges for the design of the microwave cavity or magnetic/optical/thermal shielding around the atomic ensemble and introduce disadvantageous sensitivities to changes in sensor orientation. The disclosed device for preparing an ensemble of laser-cooled atoms and measuring their population eliminates the need for a secondary optical path for a detection beam, since the same optical path used for cooling and/or state preparation is used for absorptive or dispersive state detection after the clock cycle. In some embodiments, a polarizing beam-splitter (e.g., a polarizing beam-splitter cube or a polarization prism) can be used to route the optical beam into the optical path, and suitable polarization optics within the optical path can allow the returning beam to exit a separate beam-splitter port for detection outside of the atom-containing region. In some embodiments, the input beam is polarized such that a small amount is deflected away from the cooling/state-preparation path, providing an independent measurement of the input beam intensity that can be used to normalize the absorption measurement and mitigate the influence of beam power variation. In the racetrack configuration, the polarization of the beam along the different axes within the racetrack can be modified with optics within the racetrack in order to support laser cooling via a three-dimensional (or two-dimensional) optical molasses (OM) or magneto-optical trap (MOT). If the detection beam is well collimated, the optical absorption by the atoms can be detected at a large distance from the atom ensemble, thereby achieving better measurement signal-to-noise ratio than fluorescence detection and requiring a much smaller light collection solid angle.

In some embodiments, the intersecting beam path passes the detection beam through the atomic sample multiple times (nominally six times for a simple 3D optical racetrack). Because of this, the overall absorption/dispersion of the beam is enhanced compared to a single-pass or simple retroreflected measurement. The electric field of a laser beam as it propagates through a uniform vapor in the z direction has the form $E(z)=E_0 \exp(i\omega t-ikz)\exp(-k\sigma Nz)\exp(-ikn'Nz)$, where k is the angular wave number, N is the number of atoms per unit volume, $\sigma$ and n' represent the absorption and the dispersion of the atomic vapor, respectively. $\sigma$ and n' are related to the imaginary part and the real part of the complex refractive index, which is a function of the laser frequency, $\omega$, and the atomic resonance frequency, $\omega_0$. Multiple passes of the laser beam through the atom vapor effectively increases the path length z in this equation, enhancing both the absorption and the dispersion. The atomic absorption of the laser beam, $I(z)=I_0 \exp(-2k\sigma Nz)$, can be measured readily using a square-law photo detector. The number of atoms can be derived by using the relation $N \propto \mathrm{Log}\,[I(z)/I_0]$. The logarithm function can be expanded into a power series, either about 1 or about a nominal operational value of $I(z)/I_0$. In the case of a cloud of $10^6$ laser-cooled Rb atoms contained in a 3D optical molasses racetrack, it is estimated that an 8 µW beam on resonance with the D2 cycling transition will experience 7% absorption. In this example, the first term of the logarithm function expansion about 1, i.e., $1-I(z)/I_0$, introduces ~3.7% systematic error in the derivation of N. This error can be reduced by including higher order terms of this expansion or expanding the logarithm function about a nominal operational value as mentioned above. Other type of approximations can also be used here. On the other hand, the optical phase shift due to the atomic dispersion is linear to the number of atoms per unit volume N. This optical phase shift can be translated to the phase shift of an RF signal using heterodyne detection methods. The well-developed RF signal phase measurement methods are less sensitive to signal amplitude fluctuations. As a result, the dispersion measurement method has a larger dynamic range and it is more immune to the laser amplitude noise (laser intensity noise).

The three-dimensional optical racetrack detection design can also mitigate reduction in detection efficiency arising from atom motion or device acceleration. In a cold-atom clock relying on fluorescence-based detection, accelerations of the sensor during the clock cycle serve to displace the atoms with respect to the fluorescence collection optics; this in turn alters or reduces detection efficiency, potentially introducing a systematic error in the atom state measurement and/or clock frequency. A similar reduction in detection efficiency can occur in a cold-atom clock that relies on absorption detection using only a single-axis detection beam (even if it is directly retroreflected)—accelerations transverse to the beam direction will result in atom displacement out of the detection beam. In a multidimensional optical racetrack configuration, atoms can be displaced along any of the axes of the optical racetrack and still be detected by one or more of the beams. In the case of a cold-atom clock operating in Earth's gravity, this detection scheme motivates short microwave interrogation times to ensure that atoms do not fall out of the central region once the cooling/trapping light is extinguished. Short cycle times are also beneficial for mitigating systematic errors that couple to atom displacement and for relaxing stringent phase noise requirements on the microwave oscillator.

An aspect of the present disclosure includes a novel, simple absorption detection scheme that reduces the laser system complexity compared to fluorescence detection and simplifies the optical design of the detection system. Most optical path designs can be easily adapted for absorption measurements, including a racetrack optical beam layout for a 3D-MOT or 3D-OM design in which a laser beam entering a single input port can be redirected to interact with the cloud of atoms numerous times. In some embodiments, the racetrack light passes through the atom cloud six times with polarization controlled by polarizing optical elements to form a 3D-MOT or 3D-OM, ultimately exiting from the input port. The 3D-MOT or 3D-OM light can be repurposed to serve as an absorption detection beam by tuning it to resonance or applying a resonant frequency sideband. In some embodiments, a resonant sideband is produced with an electro-optic modulator.

In some embodiments, the low intensity allows ~1 ms detection times without undue dissipation of the atoms, which reduces the photon shot noise contribution. For a 1 ms detection time and >$10^5$ atoms, the measurement noise approaches the quantum projection noise limit. This performance easily supports the SNR requirements for many devices such as a compact microwave clock, and the simplified geometry eliminates a significant integration challenge. In particular, eliminating a separate detection beam and imaging components allows use of larger cooling beams and simplifies the requirements for the laser control system, optical layout, and alignment, as well as minimizing the optical apertures which must be incorporated in the microwave cavity and magnetic shields. This detection technique also facilitates independence from the orientation of the device with respect to gravity, as atoms can be detected as long as they remain within the 3D-MOT or 3D-OM beams. Atoms remaining within the cooling beams after the measurement cycle may be efficiently recaptured for use in subsequent cycles, increasing the steady-state number of atoms participating in the measurement and increasing SNR. In some embodiments, only a beam-splitter and a mirror must be added to the implementation of the atom trapping and cooling system to facilitate absorption detection. The 3D-MOT or 3D-OM polarizations can be used for absorption detection without change. In some embodiments, 3D-OM may be preferable for absorption.

In some embodiments, $^{87}$Rb atoms are used, and absorption is detected on the $^2S_{1/2}$-$^2P_{3/2}$ $D_2$-line F=2→F'=3 cycling transition. In other embodiments, the F=2→F'=1 or F=2→F'=2 transitions may reduce sensitivity to laser frequency noise for larger laser linewidth or larger numbers of atoms.

Because the detection beam is below saturation intensity for the atoms, noise in the intensity will directly lead to noise in the scattering rate. Given that the atom signal is a few percent of the total light level, intensity stability at the $10^{-5}$ level would be needed for SNR of 1000. In some embodiments, sensitivity to laser intensity noise may be mitigated by using a dual balanced photodiode circuit to reject common mode intensity noise between the atom signal path and a reference beam. Commercial balanced photodiodes are readily available with up to 50 dB rejection of common mode intensity fluctuations in similar configurations. In some embodiments, the required intensity stability for the system is only approximately 10% and does not play a major role in the measurement signal-to-noise ratio.

In some embodiments, optical frequency modulation can be applied to allow detection at frequencies above DC, reducing sensitivity to amplitude noise and reducing the requirements on intensity stability such that a low-bandwidth servo is sufficient for stabilization. In various embodiments, this modulation can be achieved by methods such as direct laser modulation, an electro-optic modulator, or an acousto-optic modulator.

In some embodiments, the disclosed detection scheme is applied to an atomic frequency reference based on an atomic vapor cell containing thermal atoms; this cell may or may not also contain a buffer gas. In this case, the same optical racetrack routes an input beam to provide optical pumping and detection light. In some embodiments, this vapor-cell frequency standard is based upon pulsed optical pumping, with a microwave interrogation sequence taking place prior to atom population measurement via absorption detection. In some embodiments, this vapor-cell frequency standard is based upon excitation of an atomic coherence with modulated pumping light sent into the optical racetrack, either continuously or in an intermittent fashion. In some embodiments, optical absorption is measured concurrent with the modulated pumping process.

In some embodiments, the disclosed detection scheme is applied to inertial sensors. The cold-atom inertial sensor is configured to measure acceleration, gravity, gravity gradients, rotation, or a combination of the above. In some embodiments, the sensor is based on matter-wave interferometry of a cloud of laser-cooled atoms. In this case, the populations of atomic sublevels can be measured by absorption of a resonant or near-resonant beam sent into the same optical path as the cooling or state preparation light. In some embodiments, the laser-cooling and absorption detection beams are from the same laser with adjustable frequency and intensity.

In some embodiments, the disclosed detection scheme is applied to inertial sensors and/or frequency standards based upon a beam of atoms or molecules. Such sensors could include thermal-beam atom-interferometer inertial sensors including accelerometers, gravimeters, gravity gradiometers, and/or gyroscopes; and also include thermal-beam atomic frequency standards. In some embodiments, the atoms or molecules in this beam are laser-cooled in the directions transverse to or along the mean beam velocity. In some embodiments, an optical racetrack is used for optical cooling or state preparation of the atoms within a beam, and the same optical racetrack is used to deliver a state-detection beam to interrogate the atomic state populations after a frequency or inertial measurement. In some embodiments, two optical racetracks with a common laser source are used for cooling and detecting the atoms within the beam at different distances from the atom beam source.

FIGS. 1A-D are diagrams illustrating embodiments of 3D renderings of a microwave (uW) cavity design and internal opto-mechanical assembly for a 3D optical cooling region.

FIG. 1A is a diagram illustrating an embodiment of a 3D rendering of a uW cavity design. In the example shown, the full assembly is shown that includes an outer microwave cavity body 100, internal opto-mechanical assembly 102, and light beam path 103 visible through an upper port. Microwave power from uW frequency generator is input to the cavity by two coaxial feeds via connector 105 and connector 106 located at the cavity mid-plane. In some embodiments, the cavity resonance frequency can be fine-tuned by adjusting the insertion of an upper endcap (not shown) that covers the opening at the top of outer microwave cavity body 100. The upper endcap includes a transparent port enabling light to enter microwave cavity body 100 to follow light beam path 103. Microwave cavity body 100 is enclosed within a larger vacuum chamber (also not shown) as it is not hermetically sealed. In some embodiments, microwave cavity body 100 and the vacuum chamber are combined into one component. Connector 105 and connector 106 terminate in two tiny wire loops (not visible) which generate electro-magnetic fields at microwave frequencies. The optics and their support structure are fused silica, which exhibits low dielectric loss. The atomic beam enters the cavity through port 104.

FIG. 1B is a diagram illustrating an embodiment of a 3D rendering of an internal opto-mechanical assembly and beam path. In the example shown, the internal opto-mechanical assembly and beam path are shown with outer microwave cavity body 100 removed. Incoming light beam 109 from above propagates along the −z direction and reflects off mirror 116. The beam is then diverted toward mirror 112, which reflects it along the +x direction toward mirror 118. Mirror 118 reflects the beam toward mirror 114, which diverts the beam along the −y direction toward mirror 110. The beam strikes mirror 110 at normal incidence and is retro-reflected along the same path, ultimately leaving the racetrack along the +z direction. The 3D OCR is defined by the overlap among the beams traveling along the ±x, ±y, and ±z directions. Mirror 116, mirror 112, mirror 114, mirror 118, and mirror 110 are cemented to optical alignment baseplate 108. Mirror 114 is cemented to baseplate 111, which is also cemented to baseplate 108.

FIG. 1C is a diagram illustrating an embodiment of a zoom of an optical beam path and 3D OCR racetrack. In some embodiments, optical beam path 130 and 3D OCR racetrack of FIG. 1C correspond to optical beam 109 and 3D OCR racetrack of FIG. 1B without baseplate 108 and baseplate 111. In the example shown, the 3D OCR is defined by the overlap among the beams traveling along the ±x, ±y, and ±z directions, and the atom cloud zone is shown as a circle 132. The beams 130 comprise triaxial (but not necessarily orthogonal) counterpropagating beam paths which can serve for laser cooling of atoms within a magneto-optical trap or optical molasses or could serve for state preparation in an ensemble of thermal atoms. The same optical path is used for the detection beam, absorption of which indicates the atomic sublevel population of atoms within the racetrack. In some embodiments, a central spatial zone (e.g., zone 132) within a trap is traversed along one or more axes by a laser beam. In some embodiments, a central spatial zone (e.g., zone 132) within a trap is traversed twice, once in each direction, along one or more axes by a laser beam.

FIG. 1D is a diagram illustrating an embodiment of a zoom of an optical beam path. In some embodiments, optical beam path 134 of FIG. 1D is a zoom of the light path 130 of FIG. 1C. In the example shown, the numbers 1, 2, 3, 4, 5, and 6 indicate the route the light takes coming into the 3D optical racetrack and retraces on the way out of the 3D optical racetrack. Region 136 indicates the atomic cloud region within the 3D OCR.

FIG. 2 is a diagram illustrating an embodiment of a 3D rendering of an internal mounting frame assembly. In some embodiments, baseplate 108 of FIG. 1 is implemented by baseplate 208 of FIG. 2 and baseplate 111 of FIG. 1 is implemented by baseplate 211 of FIG. 2. In some embodiments, baseplate 208 is cemented to baseplate 211. In the example shown, the internal mounting frame assembly is shown with the mirrors or reflecting surfaces removed. The frame enables proper alignment and easy assembly for the 3D racetrack optics. Each of the mirrors has a wedge shape where the wedge has two plane surfaces that have a 22.5° angle between the planes; one or both of these plane surfaces is reflective. The end of the wedge is perpendicular to one of the two plane surfaces. The edges of the wedge are perpendicular to both of the two plane surfaces. In some embodiments, all five mirrors comprising the 3D racetrack optics have the same design. The surfaces of the wedge are used disposed against the surfaces of baseplate 208 and baseplate 211 to simplify assembly and alignment. A first mirror is disposed against surface 216, which directs a beam coming down from the top toward a second mirror disposed against surface 212. In some embodiments, the first mirror is attached to surface 212 by its side. The second mirror disposed against surface 212 directs the beam toward a third mirror disposed against surface 218 and resting against baseplate 211. The beam propagates from the third mirror toward a fourth mirror disposed against surface 214. The beam propagates from the fourth mirror toward a fifth mirror disposed against surface 210. The beam then retraces its path to exit out the top.

In some embodiments, mirror 116 of FIG. 1 is mounted to baseplate 211 at mounting point 216. In some embodiments, mirror 112 of FIG. 1 is mounted to baseplate 208 at mounting point 212. In some embodiments, mirror 118 of FIG. 1 is mounted to baseplate 208 at mounting point 218. In some embodiments, mirror 114 of FIG. 1 is mounted to baseplate 211 at mounting point 214. In some embodiments, mirror 110 of FIG. 1 is mounted to baseplate 208 at mounting point 210.

Figure 3:
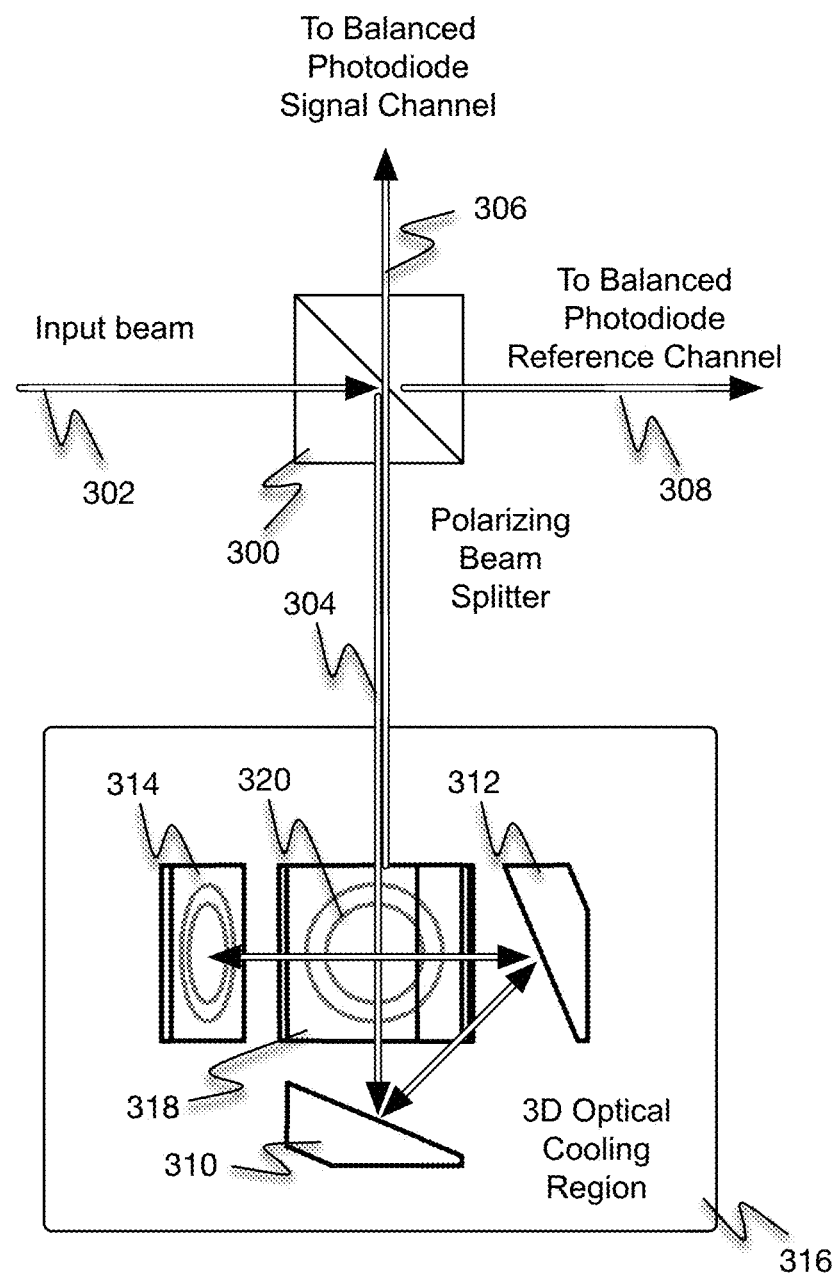
FIG. 3 is a diagram illustrating an embodiment of an optical racetrack layout with balanced detection of absorption by a cold-atom cloud.

FIG. 3 is a diagram illustrating an embodiment of an optical racetrack layout with balanced detection of absorption by a cold-atom cloud. In some embodiments, mirror 126 of FIG. 1 corresponds to mirror 310 of FIG. 3. In some embodiments, mirror 122 of FIG. 1 corresponds to mirror 312 of FIG. 3. In some embodiments, mirror 128 of FIG. 1 corresponds to mirror 314 of FIG. 3. In some embodiments, mirror 120 of FIG. 1 corresponds to mirror 318 of FIG. 3. In some embodiments, beam path 130 of FIG. 1 represents a rendered three-dimensional path of the beam following path 304 in FIG. 3. In the example shown, the optical racetrack layout directs input beam 302 into 3D optical cooling region 316 via a polarizing beam-splitter 300. Input laser beam 302 is incident upon a polarizing beam-splitter cube 300 with its polarization axis chosen to reflect some of the light down into 3D optical cooling region (OCR) 316 along path 304 and transmit some of the light along path 308 into the reference channel of a balanced photodiode. Light traveling into 3D OCR 316 traverses central spatial zone 320 where an atom cloud is located for measurement and is reflected by mirror 310 toward mirror 312, which subsequently steers the laser beam toward mirror 314 along a transverse direction. Mirror 314 reflects the beam out of the page toward a subsequent mirror (not shown), which reflects the beam back into the page and toward final mirror 318, which retroreflects the beam back along its original path. A polarization optic (not shown) rotates the light polarization by nearly 90 degrees at mirror 318, so that the outgoing beam along path 304 is now transmitted through polarizing beam-splitter cube 300 to the signal channel of the balanced photodiode. Relative measurement of the powers of beam 306 and beam 308 indicates absorption of the beam by atoms in the atom cloud region. In some embodiments, central spatial zone 320 within 3D OCR 316 is traversed along one or more axes by a laser beam, where the laser beam is measured before and after traversing central spatial zone 320. In some embodiments, central spatial zone 320 within 3D OCR 316 is traversed twice, once in each direction, along one or more axes by a laser beam, where the laser beam is measured before and after traversing central spatial zone 320. In some embodiments, a measurement of the laser beam before and after traversing central spatial zone 320 is used to measure absorption of atoms in central spatial zone 320.

Figure 4:
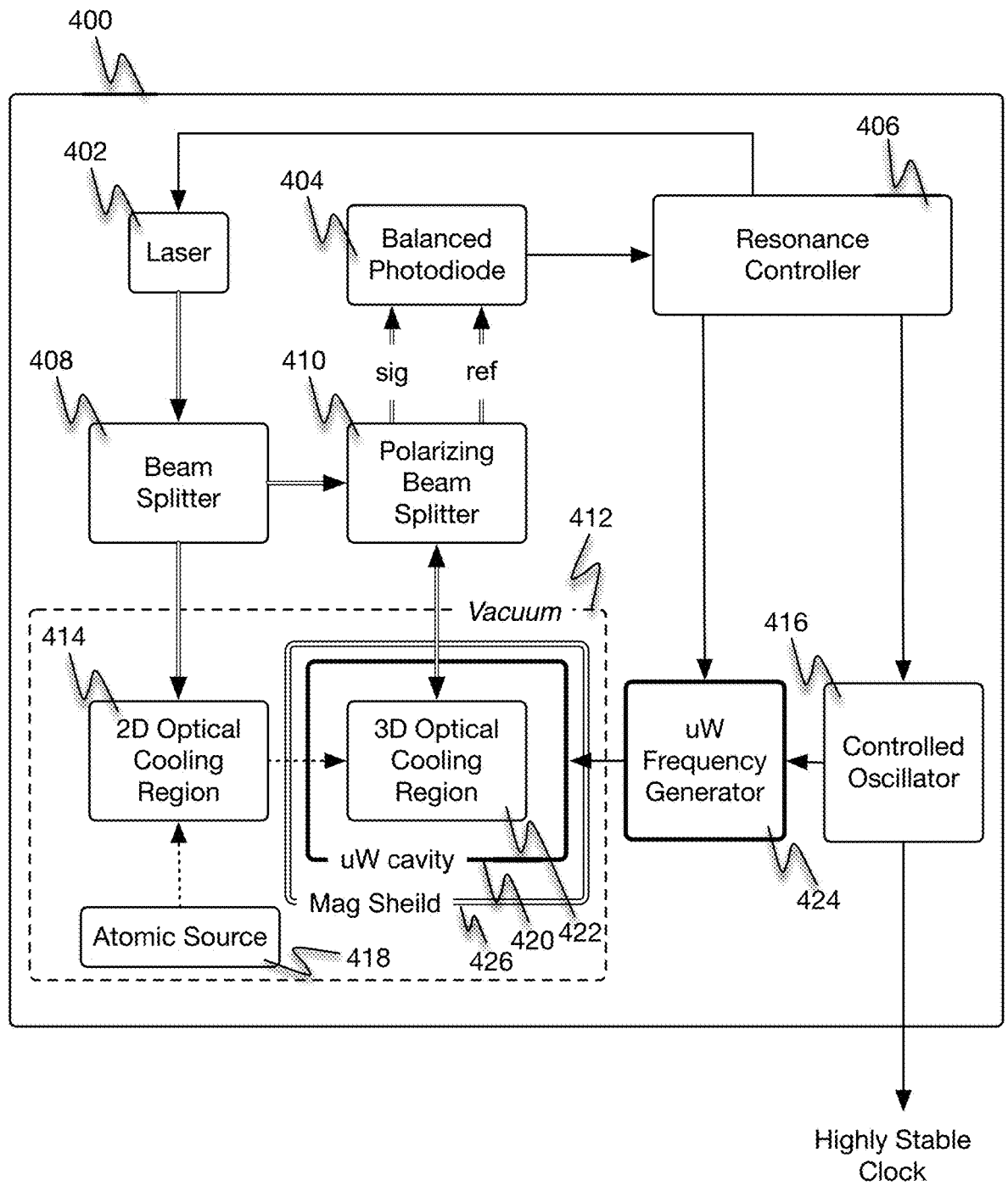
FIG. 4 is a block diagram illustrating an embodiment of an architecture for compact cold atom clocks.

FIG. 4 is a block diagram illustrating an embodiment of an architecture for compact cold atom clocks. In the example shown, light beam from laser 402 is split via beam splitter 408 and polarizing beam splitter 410 to divert light to 2D optical cooling region (2D OCR) 414, 3D optical cooling region (3D OCR) 422, and the reference channel of balanced photodiode 404. Light returning from 3D OCR 422 has its polarization rotated 90° with respect to the inbound light and passes through polarizing beam splitter 410 along the signal path to be detected by the signal channel of balanced photodiode 404. Balanced photodiode 404 and associated electronics measure the signal while rejecting common mode noise between the signal and reference due to intensity variations. Components within dashed box 412 are maintained under high vacuum. For example, 2D OCR 414, 3D OCR 422, microwave (uW) cavity 420, and magnetic shield 426 surrounding microwave cavity 420 are all in vacuum, resulting in improved immunity to environmental perturbations such as temperature changes, dust, or acoustical noise.

In some embodiments, laser 402 utilizes an atomic lock reference that keeps the laser tuned on or near the atomic absorption wavelength. For example, because lasers emit light over a narrow range of wavelengths and atoms absorb light over a similarly narrow range of wavelengths, without active control of the laser wavelength, the laser output will drift away from the atomic absorption wavelength over a rather short timescale. In some embodiments, the laser's atomic lock reference is a separate alkali cell containing the same atoms as the atomic source 418. Measuring the alkali atom's interaction with laser 402 produces an error signal for wavelength stabilization of laser 402. In some embodiments, laser 402 comprises a two-tone laser system with agile detuning and independent control of cooling and re-pump light intensity.

In some embodiments, atomic source 418 produces atomic vapor for 2D OCR 414 using any element with transitions that are addressable by laser cooling techniques. For example, atomic source 418 uses appropriate isotopes of alkali atoms (cesium, rubidium, etc.) or alkaline earth atoms (strontium, calcium, etc.) or any other appropriate atoms. In some embodiments, $^{87}$Rb (rubidium) atoms are used as a source, and a microwave transition at 6.835 GHz is used for the atomic clock transition frequency.

In some embodiments, 3D OCR 422 is enclosed within uW cavity 420 in order to provide homogeneous excitation of a microwave resonance. For example, excitation of the hyperfine resonance within the resulting cold-atom cloud provides an atomic reference to stabilize a controlled oscillator. Separation of the initial atom cooling region 2D OCR 414 from the spectroscopy region in microwave cavity 420 allows the microwave transition to be unaffected by the large optical and magnetic fields required for atom cooling, resulting in improved accuracy.

In some embodiments, magnetic shield 426 comprises a multi-layer magnetic shield that surrounds uW cavity 420. For example, magnetic shield 426 separates 3D OCR 422 from the strong magnetic fields of 2D OCR 414 as well as shields the atoms from undesirable environmental perturbations.

Resonance controller 406 receives input from balanced photodetector 404 and controls laser 402, microwave (uW) frequency generator 424, and controlled oscillator 416. For example, the absorption signal from balanced photodetector 404 contains information about the atomic state distribution in the atom cloud within 3D OCR 422. In turn, the atomic state distribution reflects the degree to which uW frequency generator 424 is in resonance with a transition frequency of the atom cloud and is used by the resonance controller to match the frequency of uW frequency generator 424 to the atomic state transition frequency. When resonance controller 406 determines that the frequency of uW frequency generator 424 is matched to the atomic state transition frequency, it synchronizes the frequency of controlled oscillator 416 to a fixed proportion of the frequency of uW frequency generator 424. In some embodiments, resonance controller 406 outputs a digital control signal for a digital to analog converter (DAC) which then outputs an analog voltage to control controlled oscillator 416. In some embodiments, controlled oscillator 416 is a voltage-controlled crystal oscillator (VCXO). In some embodiments, controlled oscillator 416 is digitally controlled and receives a digital control signal from resonance controller 406.

Resonance controller 406 implements a cyclic temporal laser control sequence necessary to cool the atoms, prepare them into a known state, and detect them after microwave interrogation. Each distinct step in the control sequence requires different laser tunings and/or laser powers. During a single cycle of the laser control sequence, the laser wavelength and/or power is adjusted by controlled increments in order to accomplish cooling, state preparation, and measurement. The temporal laser control sequence occurs once per cycle and is distinct from the much slower feedback loop which steers controlled oscillator 416 based upon atom measurements in multiple successive laser control cycles. Controlled oscillator 416 outputs a highly stable clock.

Figure 5:
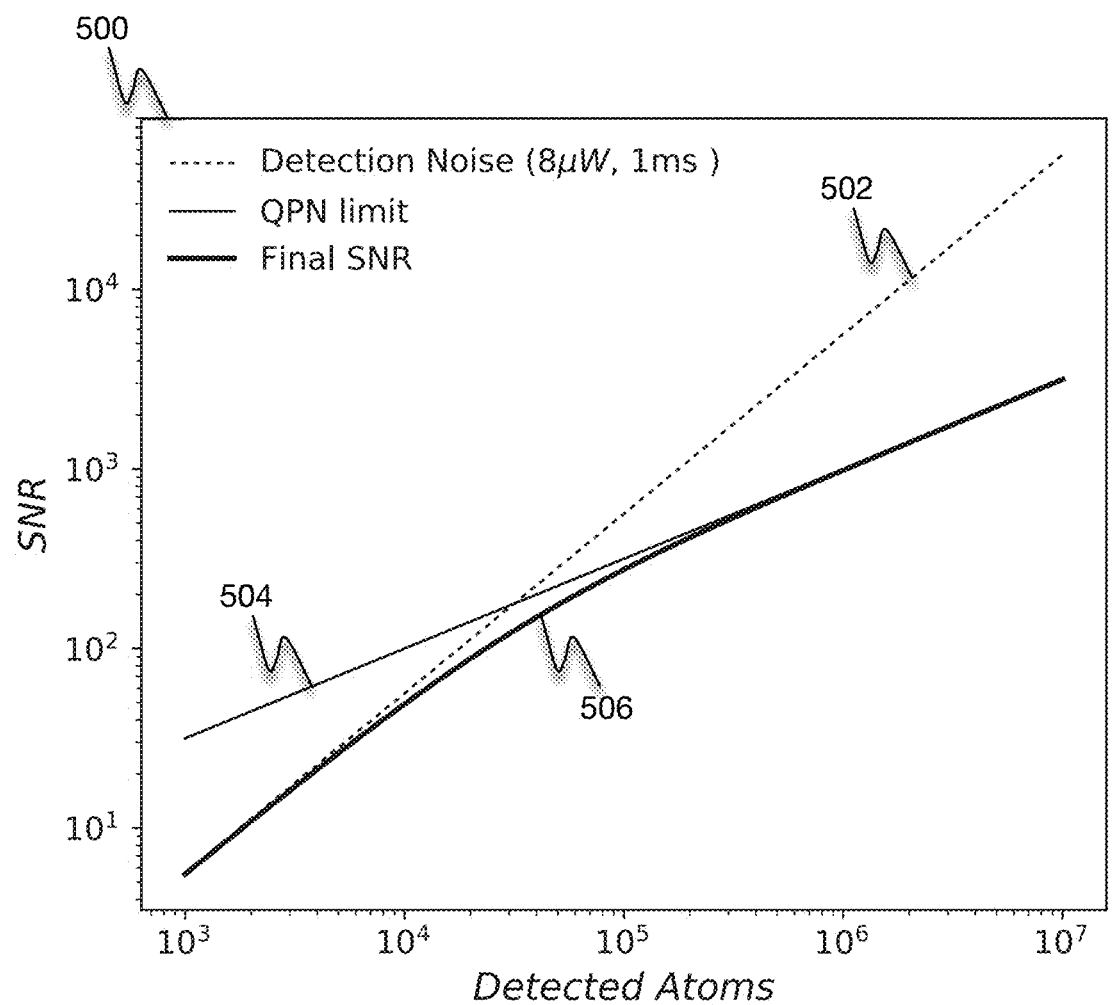
FIG. 5 is a diagram illustrating an embodiment of a signal-to-noise ratio model for detection of absorption by a cold-atom cloud using the cycling transition.

FIG. 5 is a diagram illustrating an embodiment of a signal-to-noise ratio model for detection of absorption by a cold-atom cloud using the cycling transition. In the example shown, plot 500 displays SNR (curve 506) as a function of atom number for detection via absorption of a beam tuned to the F=2→F'=3 cycling transition in $^{87}$Rb. Quantum projection noise "QPN" limit is shown as curve 504 which limits at higher numbers of detected atoms, and photon shot noise which limits at lower numbers of detected atoms limit is shown as curve 502 for an 8 μW, 1 ms long pulse. For very small atom number, the SNR grows linearly since the noise contribution due to photon shot noise on the 8 μW is fixed while the atom signal grows. The SNR is found to be QPN-limited for atom number above approximately $10^5$.

Figure 6:
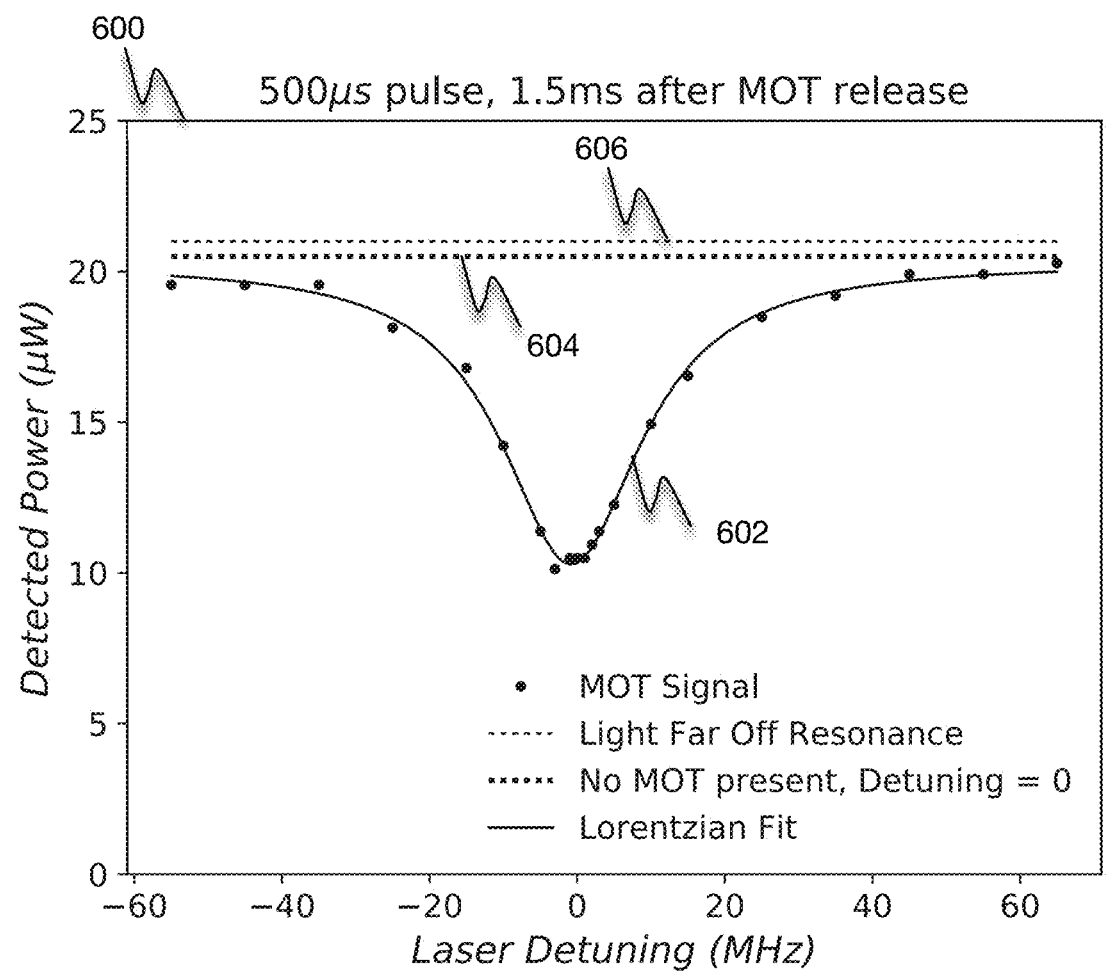
FIG. 6 is a diagram illustrating an embodiment of an absorption measurement.

FIG. 6 is a diagram illustrating an embodiment of an absorption measurement.

In the example shown, plot 600 depicts the results of a technology validation experiment relating to the absorption detection scheme. Using a 3D optical cooling region (3D OCR), absorption measurements were made to validate the absorption approach. A 50/50 beam splitter was used to route the 3D OCR return light to a photodiode. The 3D OCR was loaded with >10' atoms as estimated in an independence fluorescence measurement. After loading, the 3D OCR light was extinguished for 1.5 ms and then pulsed on for 500 μs with variable detuning and a minimum available power of 50 μW (saturation parameter s=0.2). Detected power at the photodiode is plotted (curve 602) as a function of the detection laser pulse detuning. When the laser is tuned on resonance, the absorption levels from the MOT are ~50%, corresponding to ~10' atoms according to our models, which is consistent with the known atom number in the MOT. At these intensity levels, 500 μs detection pulses do not significantly depopulate the cold-atom cloud, indicating that longer detection pulses are feasible. Backgrounds due to residual Rb vapor in the 3D region have a relatively small effect, as shown by curve 604 and curve 606, which indicate the detected light levels when the MOT is not present (curve 604) and when the laser is tuned very far from the Rb line respectively (curve 606).

Figure 7:
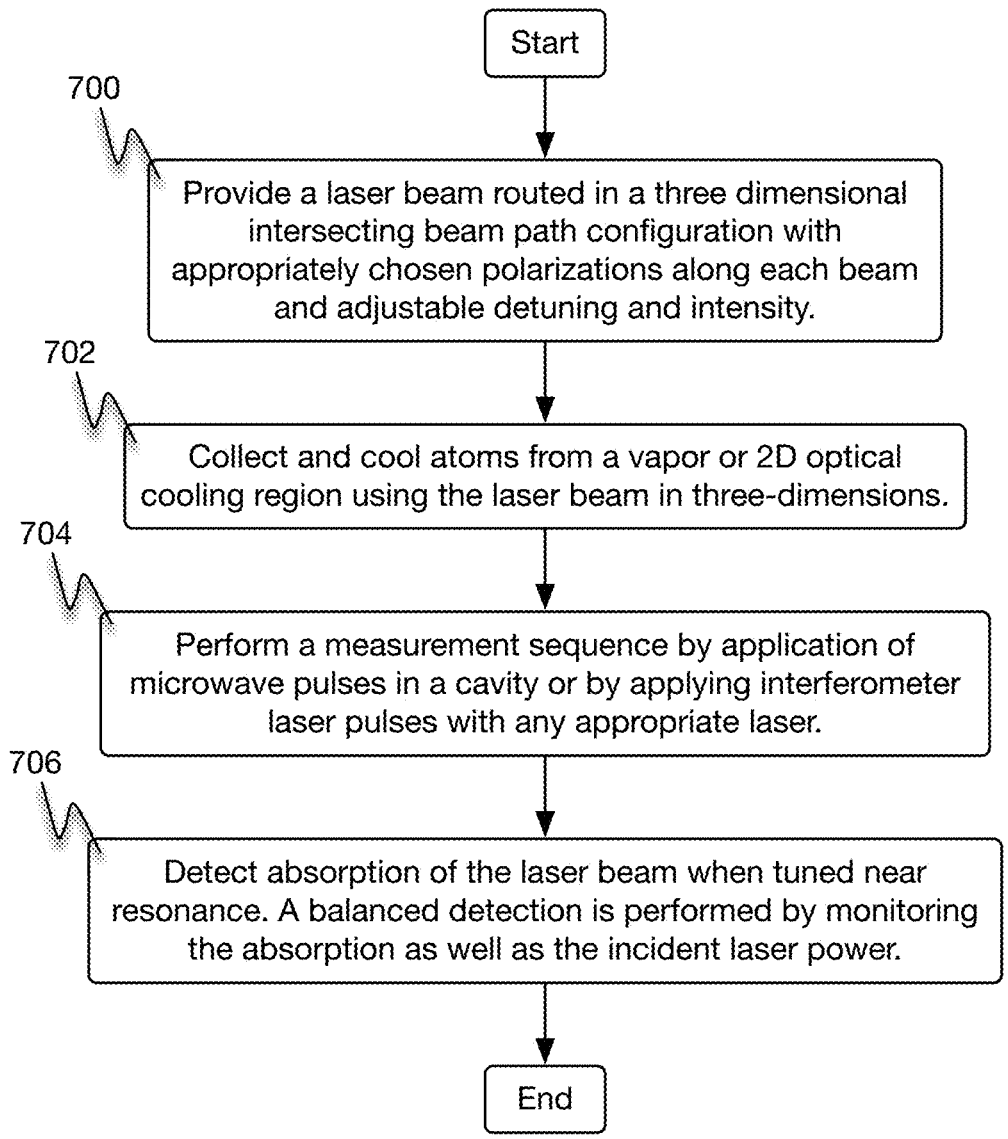
FIG. 7 is an example of a control sequence for a laser absorption measurement for a cold-atom architecture.

FIG. 7 is an example of a control sequence for a laser absorption measurement for a cold-atom architecture. In 700, a laser beam routed in a three-dimensional intersecting beam path configuration with appropriately chosen polarizations along each beam and adjustable detuning and intensity is provided. In 702, atoms are collected and cooled from a vapor or 2D optical cooling region using laser beam in three dimensions. In some embodiments, the laser beam along the intersecting beam path is used to provide additional sub-Doppler cooling (e.g., polarization gradient cooling) by adjusting detuning and intensity. In some embodiments, the laser beam along the intersecting beam path is used to prepare atoms in a particular internal state prior to the excitation of the clock transition. In 704, a measurement sequence (e.g., by application of microwave pulses in a cavity or by applying interferometer laser pulses with any appropriate laser) is performed. In 706, absorption of the laser beam when tuned near resonance is detected. For example, a balanced detection is performed by monitoring the absorption as well as the incident laser power. In some embodiments, frequency modulation is used to reduce sensitivity of intensity fluctuations.

Figure 8:
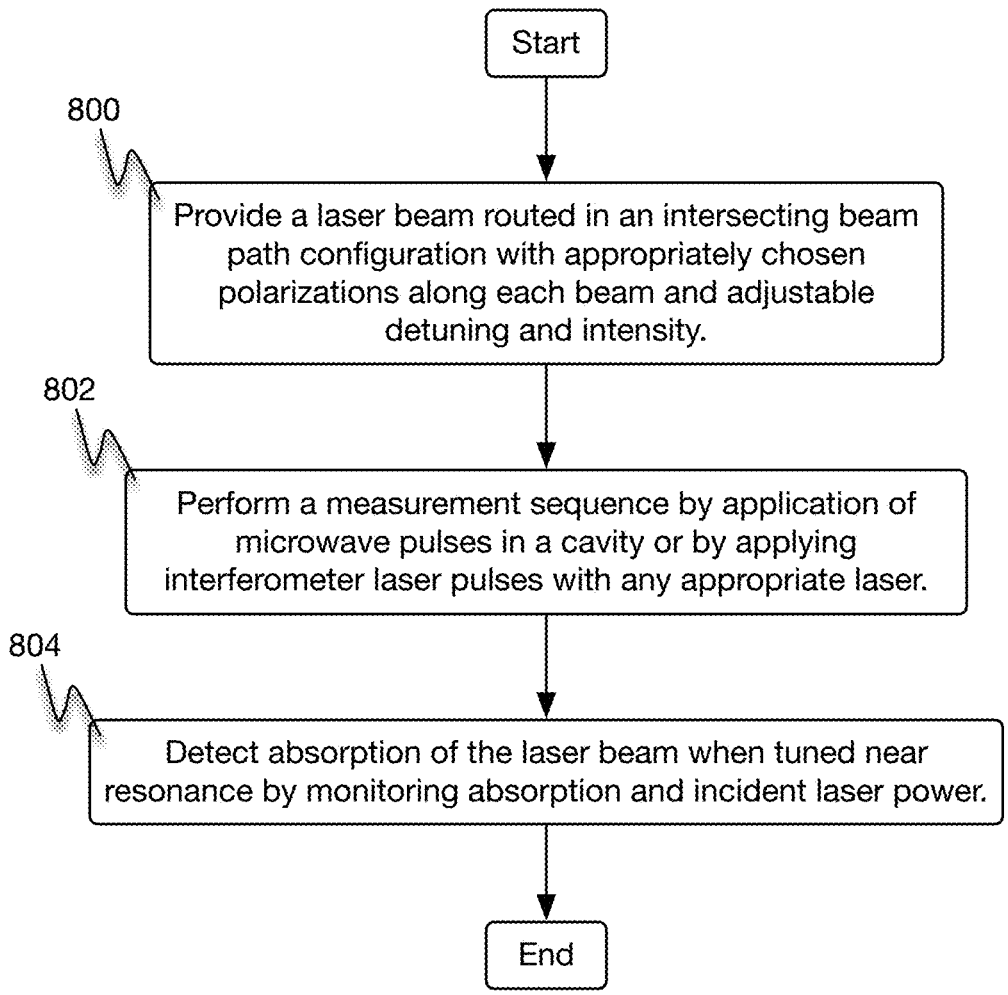
FIG. 8 is an example of a control sequence for a laser absorption measurement for a vapor-cell clock architecture (with optional buffer gas).

FIG. 8 is an example of a control sequence for a laser absorption measurement for a vapor-cell clock architecture (with optional buffer gas). In 800, a laser beam routed in an intersecting beam path configuration with appropriately chosen polarizations along each beam and adjustable detuning and intensity is provided. In some embodiments, the intersecting beam path laser beam is used to prepare atoms in a particular internal state. In 802, a measurement sequence by application of microwave pulses in a cavity or by applying interferometer laser pulses with any appropriate laser is performed. In 804, absorption of the laser beam when tuned near resonance is detected. For example, a balanced detection is performed by monitoring the absorption as well as the incident laser power. In some embodiments, frequency modulation may also be used to reduce sensitivity of intensity fluctuations. In various embodiments, the intersecting beam path dimensionality is two dimensional or three dimensional.

Figure 9:
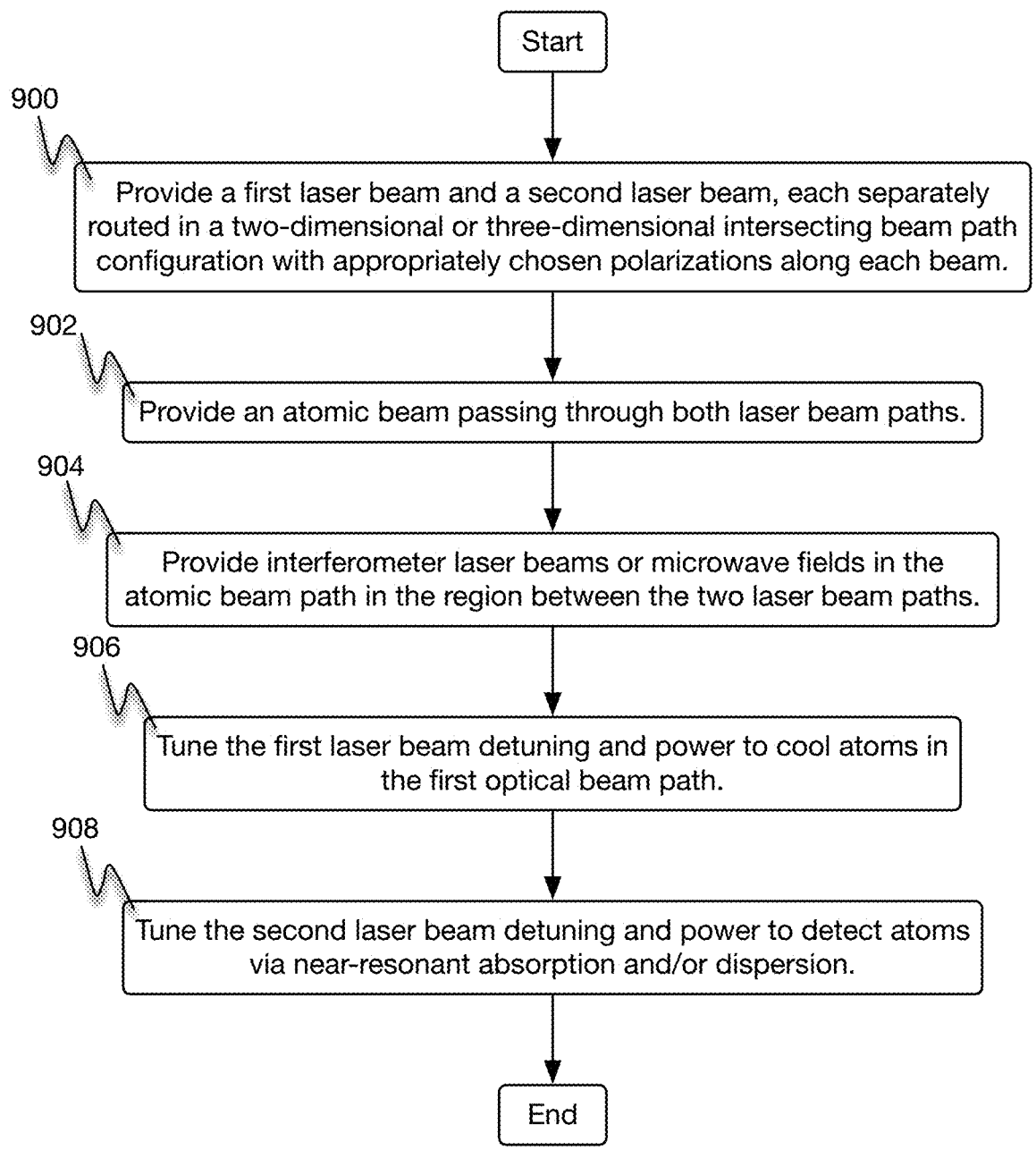
FIG. 9 is a flow diagram illustrating an embodiment of a process for a control sequence for a laser absorption measurement for a thermal-beam architecture.

FIG. 9 is a flow diagram illustrating an embodiment of a process for a control sequence for a laser absorption measurement for a thermal-beam architecture. In 900, a first laser beam and a second laser beam are provided, each separately routed in a two-dimensional or three-dimensional intersecting beam path configuration with appropriately chosen polarizations along each beam. For example, laser(s) is/are disposed to generate the first laser beam and the second laser beam, where each beam has adjustable detuning and intensity. The two laser beams can be derived from the same laser (for time-sequential measurements) or from different lasers (for continuous measurements). In 902, an atomic beam is provided which passes through both optical beam paths. For example, an atomic beam source is disposed such that an emanating atomic beam traverses a first laser beam and then later traverses a second laser beam. In 904, interferometer laser beams or microwave fields are provided in the atomic beam path in the region between the two laser beam path intersections. For example, microwave sources are positioned such that a separated pair of continuous microwave fields are able to be provided in a region (e.g., a central region) between the first laser beam intersecting the atomic beam and the second laser beam intersecting the atomic beam that can induce a Ramsey measurement of the hyperfine resonance frequency. In 906, the detuning and power of the first laser beam are tuned to achieve laser cooling the atoms in the first optical beam path. For example, a source for the first laser is disposed and adjustable such that the frequency and power can be set for the first laser beam such that atoms from an atomic beam are cooled when the atomic beam intersects the first laser beam. In 908, the detuning and power of the second laser beam are tuned to detect the atoms via near-resonant absorption and/or dispersion. For example, a source for the second laser is disposed and adjustable such that the frequency and power can be set for the second laser beam such that atoms from an atomic beam are detected in a particular state when the atomic beam intersects the second laser beam after the atoms have traversed the region (e.g., the central region) between the first laser beam intersecting the atomic beam and the second laser beam intersecting the atomic beam that can induce a Ramsey measurement of the hyperfine resonance frequency. In some embodiments, the first laser beam and second laser beam are provided by independent sources and each remains at fixed detuning and power in order to achieve a continuous measurement. In some embodiments, the first laser beam and second laser beam are provided by the same laser source, whose detuning and power can be switched to achieve laser cooling and subsequent detection. In some embodiments, a second atom beam nearly antiparallel to the first atom beam also traverses the two optical beam paths and the central region with interferometer laser beams or microwave fields.

Figure 10:
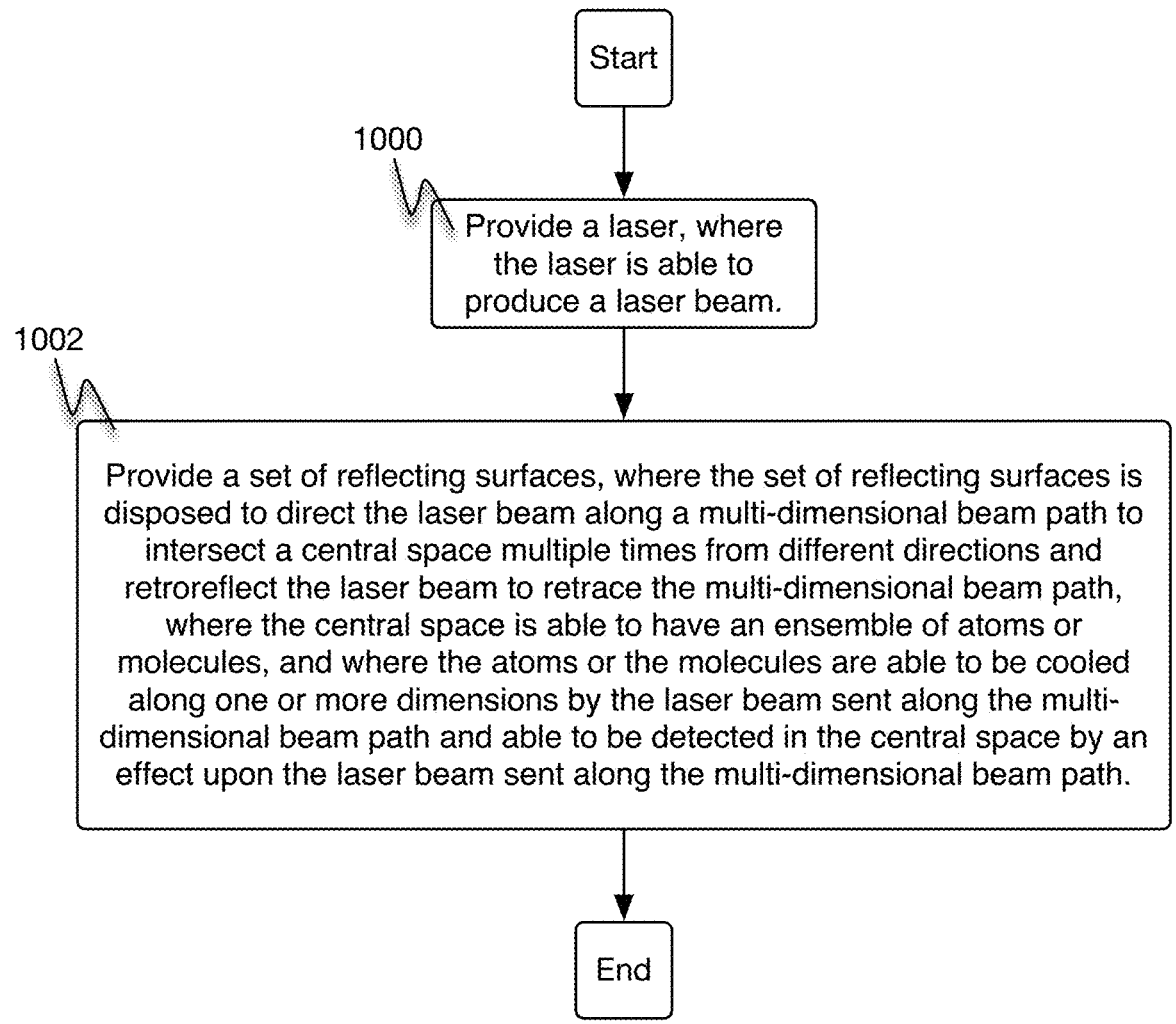
FIG. 10 is a flow diagram illustrating a method for preparing an ensemble of laser-cooled atoms and measuring their population.

FIG. 10 is a flow diagram illustrating a method for preparing an ensemble of laser-cooled atoms and measuring their population. In some embodiments, the process of FIG. 10 is implemented by opto-mechanical assembly for a 3D optical cooling region of FIG. 1. In the example shown, in 1000 a laser is provided, where the laser is able to produce a laser beam. In 1002, a set of reflecting surfaces is provided, where the set of reflecting surfaces is disposed to direct the laser beam along a multi-dimensional beam path to intersect a central space multiple times from different directions and retroreflect the laser beam to retrace the multi-dimensional beam path, where the central space is able to have an ensemble of atoms or molecules, and where the atoms or the molecules are able to be cooled along one or more dimensions by the laser beam sent along the multi-dimensional beam path and able to be detected in the central space by an effect upon the laser beam sent along the multi-dimensional beam path.

In some embodiments, the device of FIG. 10 is used for measuring the population of atoms within a quantum state when the atoms are contained within a vapor cell with or without a buffer gas instead of for preparing an ensemble of laser-cooled atoms and measuring states of the laser-cooled atoms. For this case, a laser is provided, where the laser is able to produce a laser beam. And, a set of reflecting surfaces is provided, where the set of reflecting surfaces is disposed to direct the laser beam along a multi-dimensional beam path to intersect a central space within a vapor cell multiple times from different directions and retroreflect the laser beam to retrace the multi-dimensional beam path, where the central space is able to have an ensemble of atoms or molecules, and where the atoms or the molecules are able to be cooled along one or more dimensions by the laser beam sent along the multi-dimensional beam path and able to be detected in the central space by an effect upon the laser beam sent along the multi-dimensional beam path.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device for preparing an ensemble of laser-cooled atoms and measuring their population, comprising:
    a laser, wherein the laser is able to produce a laser beam;
    a set of reflecting surfaces disposed to direct the laser beam along a multi-dimensional beam path to intersect a central space multiple times from different directions and retroreflect the laser beam to retrace the multi-dimensional beam path, wherein the central space is able to have an ensemble of atoms or molecules, and wherein the atoms or the molecules are able to be cooled along one or more dimensions by the laser beam sent along the multi-dimensional beam path and able to be detected in the central space by an effect upon the laser beam sent along the multi-dimensional beam path; and
    a frame, wherein the set of reflecting surfaces are mounted to the frame, wherein a reflecting surface of the set of reflecting surfaces comprises a mirror that has a wedge shape.

2. The device of claim 1, wherein an optical frequency and/or a power of the laser beam are independently optimized to permit the laser beam to carry out sequential steps of atom cooling/trapping, atom state preparation, and/or atom detection.

3. The device of claim 1, wherein the wedge shape has two plane surfaces that have a 22.5° angle between the two planes.

4. The device of claim 1, wherein the set of reflecting surfaces comprises five reflecting surfaces, and the multi-dimensional beam path spans three dimensions.

5. The device of claim 1, wherein the laser beam is used to detect a number of the atoms or the molecules in a selected internal state of the atoms or the molecules using resonant or near-resonant detection.

6. The device of claim 5, wherein the number of the atoms or the molecules in the selected internal state of the atoms or the molecules is measured using resonant or near-resonant absorption detection.

7. The device of claim 6, wherein higher order terms of logarithm function expansion are included in a derivation of the number of the atoms or the molecules in the selected internal state of the atoms or the molecules.

8. The device of claim 5, wherein the number of the atoms or the molecules in the selected internal state of the atoms or the molecules is measured using resonant or near-resonant dispersion detection.

9. The device of claim 1, wherein the multi-dimensional beam path produces counter-propagating light along two dimensions.

10. The device of claim 1, wherein the multi-dimensional beam path produces counter-propagating light along three dimensions.

11. The device of claim 1, wherein the device is used for an inertial measurement.

12. The device of claim 1, wherein the device is used for generating a frequency measurement for an atomic frequency standard.

13. The device of claim 1, wherein the laser beam is used with a magnetic field to produce a three-dimensional magneto-optical trap.

14. The device of claim 1, wherein the laser beam is used to produce a three-dimensional optical molasses.

15. The device of claim 1, wherein a balanced detection method is used to measure a resonant or near-resonant absorption while suppressing sensitivity to laser power fluctuations.

16. The device of claim 1, wherein a beamsplitter is used to divide light between the multi-dimensional path and a reference beam not traversing the central region to allow a resonant or near-resonant absorption signal to be detected by a balanced photodetector.

17. The device of claim 1, wherein a source of the atoms or the molecules comprises a two-dimensional laser cooled source comprising a two-dimensional magneto-optical trap or two-dimensional optical molasses.

18. The device of claim 17, wherein a sensor employing the two-dimensional magneto-optical trap or the two-dimensional optical molasses comprises an inertial sensor based upon a thermal beam of atoms.

19. The device of claim 17, wherein the device employing the two-dimensional magneto-optical trap or the two-dimensional optical molasses comprises an atomic frequency standard based upon a thermal beam of atoms.

20. The device of claim 1, wherein the laser beam is frequency modulated.

21. A method for preparing an ensemble of laser-cooled atoms and measuring their population, comprising:
    providing a laser, wherein the laser is able to produce a laser beam;
    providing a set of reflecting surfaces, wherein the set of reflecting surfaces is disposed to direct the laser beam along a multi-dimensional beam path to intersect a central space multiple times from different directions and retroreflect the laser beam to retrace the multi-dimensional beam path, wherein the central space is able to have an ensemble of atoms or molecules, and wherein the atoms or the molecules are able to be cooled along one or more dimensions by the laser beam sent along the multi-dimensional beam path and able to be detected in the central space by an effect upon the laser beam sent along the multi-dimensional beam path; and
    providing a frame, wherein the set of reflecting surfaces are mounted to the frame, wherein a reflecting surface of the set of reflecting surfaces comprises a mirror that has a wedge shape.

22. A device a for measuring the population of atoms within a quantum state when the atoms are contained within a vapor cell with or without a buffer gas, comprising:
    a laser, wherein the laser is able to produce a laser beam;
    a set of reflecting surfaces disposed to direct the laser beam along a multi-dimensional beam path to intersect a central space within the vapor cell multiple times from different directions and retroreflect the laser beam to retrace the multi-dimensional beam path, wherein the central space is able to have an ensemble of atoms or molecules, and wherein the atoms or the molecules are able to be cooled along one or more dimensions by the laser beam sent along the multi-dimensional beam path and able to be detected in the central space by an effect upon the laser beam sent along the multi-dimensional beam path; and
    a frame, wherein the set of reflecting surfaces are mounted to the frame, wherein a reflecting surface of the set of reflecting surfaces comprises a mirror that has a wedge shape.

* * * * *